(12) United States Patent
Nakaya

(10) Patent No.: US 12,428,729 B2
(45) Date of Patent: Sep. 30, 2025

(54) SUBSTRATE PROCESSING APPARATUS, METHOD OF MANUFACTURING SEMICONDUCTOR DEVICE, AND NON-TRANSITORY COMPUTER-READABLE RECORDING MEDIUM STORING PROGRAM

(71) Applicant: Kokusai Electric Corporation, Tokyo (JP)

(72) Inventor: Kazuo Nakaya, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 359 days.

(21) Appl. No.: 17/477,266

(22) Filed: Sep. 16, 2021

(65) Prior Publication Data

US 2022/0002870 A1 Jan. 6, 2022

Related U.S. Application Data

(63) Continuation of application No. PCT/JP2019/012443, filed on Mar. 25, 2019.

(51) Int. Cl.
*C23C 16/455* (2006.01)
*C23C 16/44* (2006.01)
(Continued)

(52) U.S. Cl.
CPC .... *C23C 16/45557* (2013.01); *C23C 16/4412* (2013.01); *C23C 16/52* (2013.01);
(Continued)

(58) Field of Classification Search
None
See application file for complete search history.

(56) References Cited

U.S. PATENT DOCUMENTS 4,835,114 A * 5/1989 Satou .................... F04D 17/168
118/115
6,080,679 A * 6/2000 Suzuki ................ C23C 16/4401
438/726
(Continued)

FOREIGN PATENT DOCUMENTS

EP 0343914 A1 * 11/1989
JP 10011152 A * 1/1998 ............... G01F 1/68
(Continued)

OTHER PUBLICATIONS

International Search Report, PCT/JP2019/012443, May 28, 2019, 2 pgs.

*Primary Examiner* — Karla A Moore
(74) *Attorney, Agent, or Firm* — Volpe Koenig

(57) ABSTRACT

There is provided a technique that includes: an exhaust line including a second pressure regulation valve; a bypass line including a first pressure regulation valve; and a pressure control controller configured to control the first pressure regulation valve and the second pressure regulation valve, and configured to: adjust an opening degree of the first pressure regulation valve to reduce a pressure in a process chamber from an atmospheric pressure to a second predetermined pressure; adjust the opening degree of the first pressure regulation valve to maintain the second predetermined pressure; adjust the opening degree of the first pressure regulation valve to reduce the pressure to a first predetermined pressure; detect the pressure; adjust an opening degree of the second pressure regulation valve to reduce the pressure to a third predetermined pressure; and adjust the opening degree of the second pressure regulation valve to maintain a processing pressure.

8 Claims, 6 Drawing Sheets

(51) Int. Cl.
*C23C 16/52* (2006.01)
*H01L 21/67* (2006.01)

(52) U.S. Cl.
CPC .. *H01L 21/67017* (2013.01); *H01L 21/67109* (2013.01); *H01L 21/67253* (2013.01)

(56) References Cited

U.S. PATENT DOCUMENTS

| | | | |
|---|---|---|---|
| 6,561,226 B1 * | 5/2003 | Liu | C23C 16/4412 427/248.1 |
| 6,966,967 B2 * | 11/2005 | Curry | F04D 19/04 700/282 |
| 2001/0048981 A1 * | 12/2001 | Suzuki | C23C 16/4412 427/535 |
| 2003/0092283 A1 | 5/2003 | Ozaki et al. | |
| 2005/0189074 A1 * | 9/2005 | Kasai | H01L 21/6831 156/345.33 |
| 2009/0258504 A1 * | 10/2009 | Nakaiso | C23C 16/52 118/724 |
| 2016/0053377 A1 * | 2/2016 | Taniyama | H01L 21/67769 438/758 |
| 2022/0310413 A1 * | 9/2022 | Nakaya | H01L 21/31 |

FOREIGN PATENT DOCUMENTS

| | | | | |
|---|---|---|---|---|
| JP | 2003-100645 A | 4/2003 | | |
| JP | 2003-183837 A | 7/2003 | | |
| JP | 2007-043187 A | 2/2007 | | |
| WO | WO-2005008350 A1 * | 1/2005 | | G01F 1/68 |

\* cited by examiner

FIG. 6

| No. | Recipe steps | Recipe step setting ||||
|---|---|---|---|---|---|
| | | Instructed APC | Pressure command | Valve of bypass line | Valve of exhaust line |
| 1 | APC1 slow exhaust | APC1 | SLOW VAC | OPEN | CLOSE |
| 2 | APC1 Press | APC1 | PRESS | → | → |
| 3 | APC1 slow exhaust (2nd stage) | APC1 | SLOW VAC | → | → |
| 4 | LEAK CHECK | APC1 | FULL CLOSE | CLOSE | → |
| 5 | APC2 Full Open | APC2 | FULL OPEN | → | OPEN |
| 6 | APC2 Press | APC2 | PRESS | → | → |
| 7 | APC2 Full Close | APC2 | FULL CLOSE | → | CLOSE |

 : APC not subjected to control is closed

SUBSTRATE PROCESSING APPARATUS, METHOD OF MANUFACTURING SEMICONDUCTOR DEVICE, AND NON-TRANSITORY COMPUTER-READABLE RECORDING MEDIUM STORING PROGRAM

CROSS-REFERENCE TO RELATED APPLICATION(S)

This application is a Bypass Continuation Application of PCT International Application No. PCT/JP2019/012443, filed on Mar. 25, 2019, the entire content of which is incorporated herein by reference.

TECHNICAL FIELD

The present disclosure relates to a substrate processing apparatus, a method of manufacturing a semiconductor device, and a non-transitory computer-readable recording medium storing a program.

BACKGROUND

In a substrate processing apparatus that includes a reaction furnace for processing a substrate, a substrate holder for holding the substrate in the reaction furnace, a heater for heating the substrate in the reaction furnace and a control means for controlling the temperature of the substrate so as to be raised to a processing temperature, the back surface of the substrate may be scraped off and scratched by friction at the contact portion between the substrate and the support part that supports the substrate. Adhesion of particles due to such scratches may lead to a deteriorated yield and a reduced product quality.

Therefore, according to a related art, there is known a technique for reducing friction between a substrate and a support part that supports the substrate and preventing adhesion of particles.

On the other hand, in recent years, there has been a demand for film formation in a higher vacuum than before, and there may be a need to install an exhaust line having a large diameter in an apparatus and to control a pressure control valve (hereinafter also referred to as an APC valve) corresponding to the large diameter. However, the APC valve corresponding to the large diameter fails to support wideband pressure control, and supports pressure control in a high vacuum range. Therefore, there is a possibility that stricter film formation conditions due to the miniaturization of devices in the future are not met.

SUMMARY

Some embodiments of the present disclosure provide a technique capable of performing pressure control in a wide band and in a high vacuum range.

According to one or more embodiments of the present disclosure, there is provided a technique that includes: a process chamber configured to process a substrate; an exhaust line including a second pressure regulation valve; a bypass line including a first pressure regulation valve; and a pressure control controller configured to control the first pressure regulation valve and the second pressure regulation valve, wherein the pressure control controller is configured to: adjust an opening degree of the first pressure regulation valve to reduce a pressure in the process chamber from an atmospheric pressure to a second predetermined pressure; adjust the opening degree of the first pressure regulation valve to maintain the second predetermined pressure; adjust the opening degree of the first pressure regulation valve to reduce the pressure in the process chamber to a first predetermined pressure that is lower than the second predetermined pressure; detect the pressure in the process chamber in a state in which at least the first pressure regulation valve and the second pressure regulation valve are closed for a first predetermined time when the first predetermined pressure is reached; adjust an opening degree of the second pressure regulation valve to reduce the pressure in the process chamber to a third predetermined pressure that is lower than the second predetermined pressure; and adjust the opening degree of the second pressure regulation valve to maintain a processing pressure at which the substrate is processed.

BRIEF DESCRIPTION OF DRAWINGS

FIG. 6 is a diagram showing a setting example of steps in a film-forming recipe.

DETAILED DESCRIPTION

Figure 1:
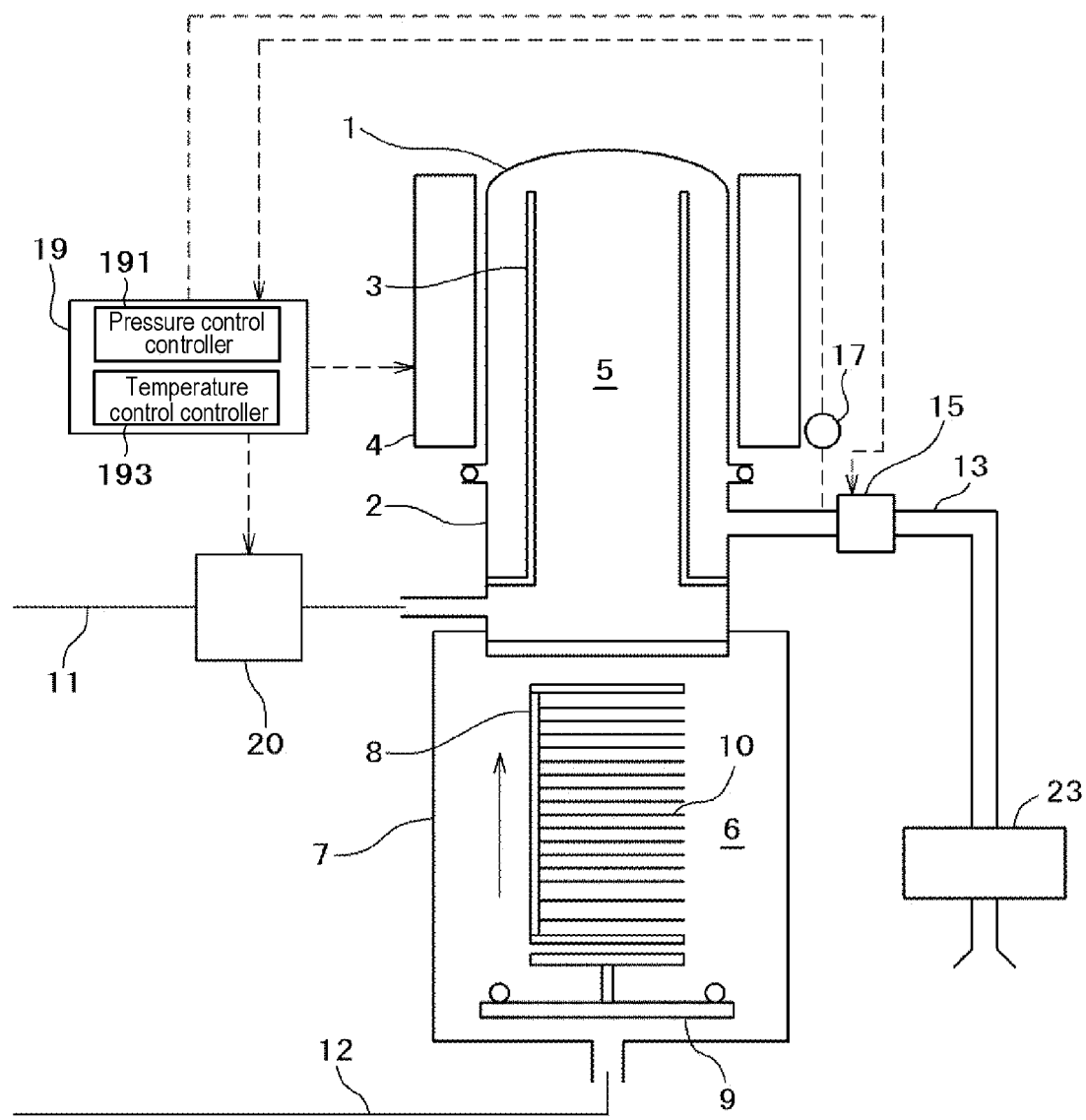
FIG. 1 is a schematic configuration diagram of a substrate processing apparatus according to one or more embodiments of the present disclosure.

Hereinafter, embodiments and modifications of the present disclosure will be described with reference to the drawings. In the following description, the same components may be designated by like reference numerals, and the description thereof to be explained one or more times may be omitted.

(Substrate Processing Apparatus)

The configuration of a substrate processing apparatus according to one or more embodiments of the present disclosure will be described with reference to FIG. 1.

As shown in FIG. 1, a reaction tube 1 of a substrate processing apparatus 100 according to the embodiments is installed to stand on a furnace opening flange 2, and an inner tube 3 is supported on the furnace opening flange 2 concentrically with the reaction tube 1. Further, a cylindrical heater 4 is installed so as to surround the reaction tube 1. A reaction furnace includes the heater 4, the reaction tube 1, and the furnace opening flange 2.

The inside of the reaction tube 1 is an airtight process chamber 5. An airtight auxiliary chamber 6 communicates with the process chamber 5. The auxiliary chamber 6 is defined by a transfer housing 7 continuously installed to the furnace opening flange 2. A boat elevator (not shown), which is a means for entering and exiting the reaction furnace, is installed in the transfer housing 7. A boat 8 which is a substrate holder is loaded into and unloaded from the process chamber 5 by the boat elevator. Further, when the boat 8 is loaded, the process chamber 5 is airtightly closed by a furnace opening lid 9.

A gate valve (not shown) is installed in the transfer housing 7. A wafer transfer machine (not shown) is installed outside the transfer housing 7. In a state in which the boat 8 is accommodated in the transfer housing 7, substrates 10 such as wafers and the like are transferred to the boat 8 via the gate valve by wafer transfer machine.

A gas introduction line 11 is in communication with the furnace opening flange 2 so as to introduce a gas into the process chamber 5 from below the inner tube 3. A gas introduction line 12 is in communication with the auxiliary chamber 6. Further, an exhaust line 13 is in communication with the furnace opening flange 2. The exhaust line 13 is connected to a vacuum pump 23 via an automatic pressure control (APC) valve unit 15.

A pressure detector 17 is installed in the exhaust line 13, and the pressure detection result of the pressure detector 17 is inputted to a controller 19.

A flow rate controller 20 is installed in the gas introduction line 11. The flow rate controller 20 controls the flow rate of the gas supplied from the gas introduction line 11 to the process chamber 5 in response to a command from the controller 19. Further, the flow rate controller 20 may be configured to control the flow rate of the gas supplied from the gas introduction line 12 to the auxiliary chamber 6.

The process chamber 5 can be brought into a vacuum state or a depressurized state by closing the flow rate controller 20 by the controller 19, stopping the gas supply, opening the APC valve installed in the APC valve unit 15, and evacuating the process chamber 5 by the vacuum pump 23.

Further, in a state in which the APC valve installed in the APC valve unit 15 is opened and the process chamber 5 is evacuated by the vacuum pump 23, the pressure detection signal from the pressure detector 17 is fed back to the controller 19. The controller 19 controls the flow rate controller 20 and adjusts the gas introduction flow rate so that the pressure detected by the pressure detector 17 becomes a set pressure.

As described above, the pressure in the process chamber 5 is controlled to a desired pressure (e.g., a set pressure) by the controller 19 by controlling the gas flow rate introduced into the process chamber 5 and the amount of the gas exhausted from the process chamber 5. Further, the temperature in the process chamber 5 is controlled to a predetermined temperature by controlling the heat generation amount of the heater 4 by the controller 19. At this time, an inert gas, for example, a nitrogen gas is used as the gas supplied via the gas introduction line 11.

In a state in which a predetermined number of substrates 10 are charged to the boat 8, the boat 8 is loaded into the process chamber 5 (boat-loading step). The process chamber 5 is heated by the heater 4 while being evacuated. In a predetermined depressurized state and a predetermined temperature maintenance state, a processing gas is introduced from the gas introduction line 11 and is exhausted. As the processing gas is supplied to the substrates 10, a desired wafer processing (substrate processing) such as thin film formation or the like is performed (substrate-processing step). When the processing is completed, the boat 8 is moved down (boat-unloading step), and the processed substrates 10 are discharged. For example, a SiN film (silicon nitride film) is formed as a thin film.

The APC valve installed in the APC valve unit 15 is configured so that it can perform evacuation and evacuation stop of the process chamber 5 by opening and closing the valve installed inside while operating the vacuum pump 23 and so that it can regulate the pressure in the process chamber 5 by adjusting the valve opening degree based on the pressure information detected by the pressure detector 17 while operating the vacuum pump 23.

The controller 19 is configured as a computer that includes a CPU (Central Processing Unit), a RAM (Random Access Memory) configured as a memory area (work area) for temporarily storing programs and data read by the CPU, a memory device configured to readably store a control program for controlling the operation of the substrate processing apparatus and a process recipe that describes the procedures and conditions of pressure control described later, and the like.

The process recipe is configured to enable the controller 19 to execute each step in a method of manufacturing a semiconductor device to obtain a predetermined result. The process recipe functions as a program. Hereinafter, the process recipe, the control program, etc. are collectively and simply referred to as a program. When the term "program" is used in the subject specification, it may indicate a case of including the process recipe, a case of including the control program, or a case of including a combination of the process recipe and the control program.

(APC Valve)

Next, the configuration of the APC valve unit 15 connected to the exhaust line 13 will be described with reference to FIGS. 2 to 5B.

Figure 2:
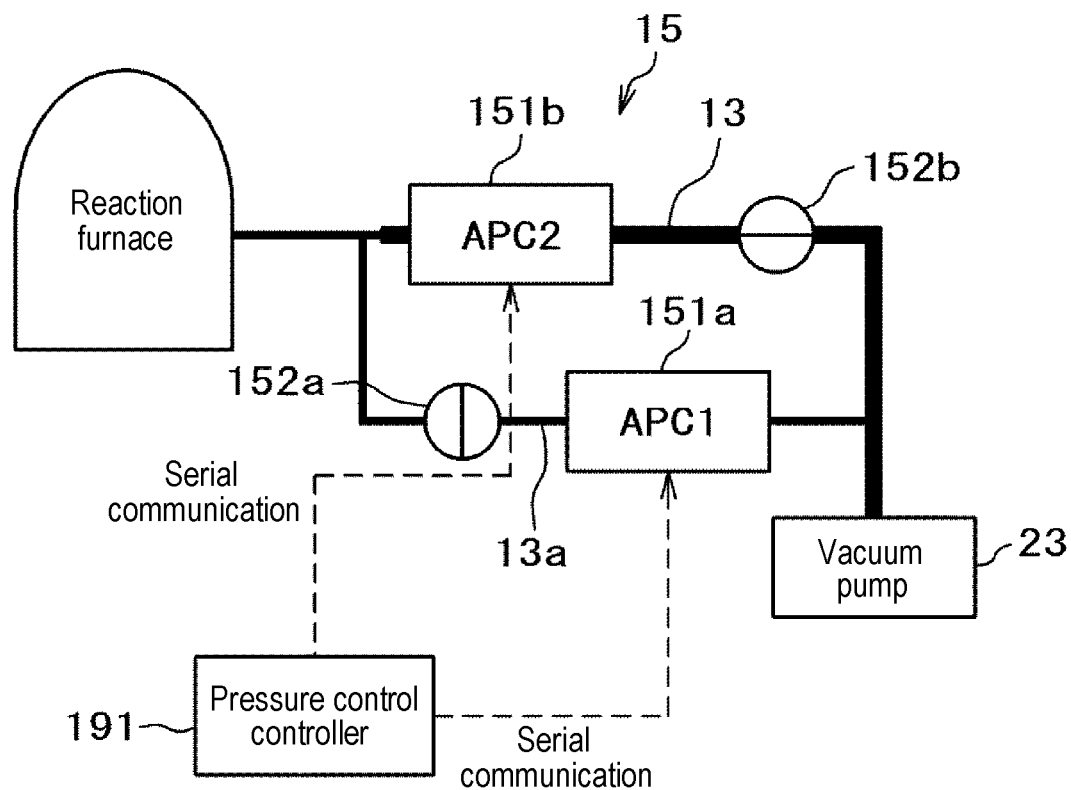
FIG. 2 is a diagram showing a configuration of the APC valve unit shown in FIG. 1.

As shown in FIG. 2, the APC valve unit 15 includes a wideband APC valve (APC1 or first pressure regulation valve) 151a and a valve 152a connected to a bypass line 13a that bypasses the exhaust line 13, and a high vacuum APC valve (APC2 or second pressure regulation valve) 151b and a valve 152b connected to the exhaust line 13. The diameter of the pipe of the exhaust line 13 is larger than the diameter of the pipe of the bypass line 13a.

A pressure control controller 191 included in the controller 19 instructs a pressure control command to the wideband APC valve 151a and the high vacuum APC valve 151b via serial communication. Instead of the serial communication, connection may be made by a digital line such as Ether CAT (a data communication network between a controller and an I/O device in an automatic control system) or the like.

Figure 3:
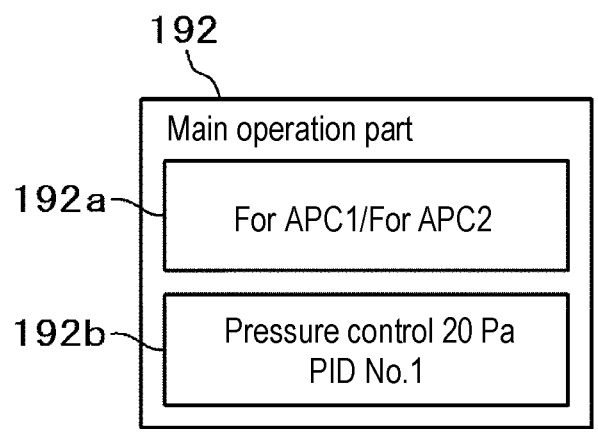
FIG. 3 is a diagram illustrating step setting in a film-forming recipe.

As shown in FIG. 3, the recipe step instruction of the film-forming recipe from the main operation part 192 of the controller 19 has a scheme of switching between the exhaust line 13 and the bypass line 13a by the pressure control controller 191. The recipe step instruction enables switching between the wideband APC valve 151a and the high vacuum APC valve 151b as pressure control instruction destinations for each step. The recipe step includes, as pressure control commands, an item 192a (APC instruction command) that specifies whether the instruction is for the wideband APC valve 151a or for the high vacuum APC valve 151b, and an item 192b (pressure command) that specifies command types and parameters for each command. Further, instructions to the valve 152b of the exhaust line 13 and the valve 152a of the bypass line 13a are given by the valve control command in the recipe step.

Figure 4A:
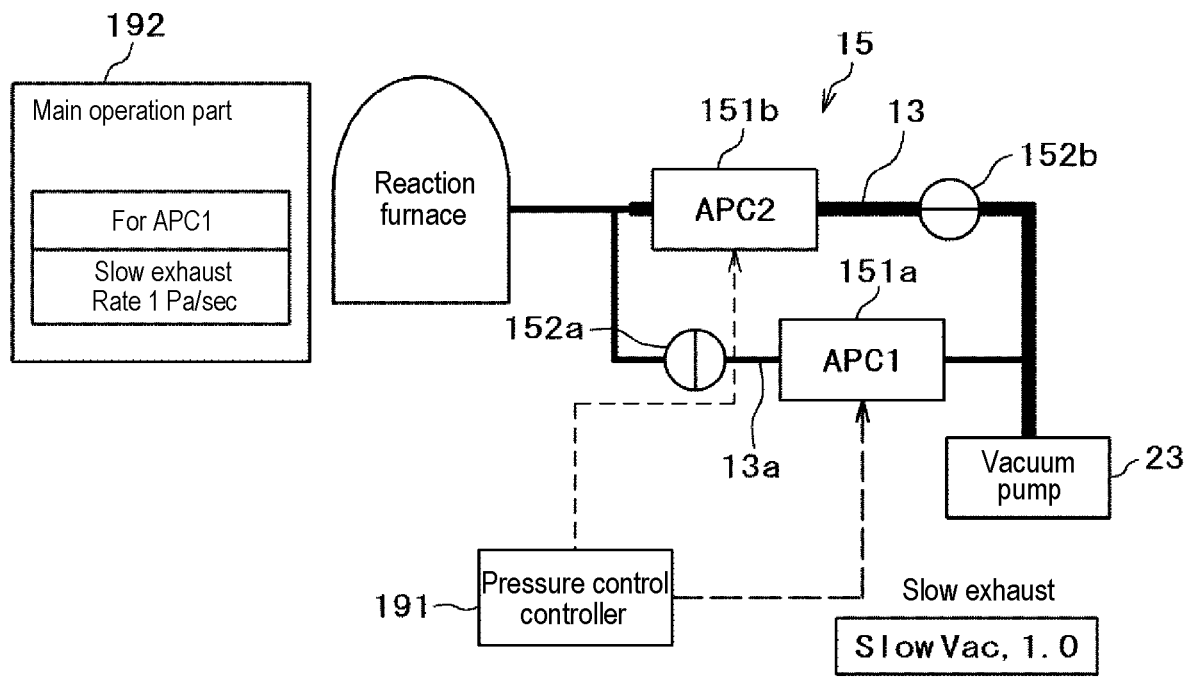
FIG. 4A is a diagram illustrating a case of controlling a wideband APC valve.

As shown in FIG. 4A, in the pressure control from the atmospheric pressure to 1330 Pa (10 Torr), "for APC1" is set by "APC instruction command" as a pressure control command, the valve 152a of the bypass line 13a is opened by a valve control command (OPEN), and the wideband APC valve 151a is instructed by pressure command (SlowVac, 1.0) as a pressure control command to perform slow exhaust at a rate of 1 Pa/sec. At this time, the valve 152b of the exhaust line 13 is closed by a valve control command (CLOSE).

Figure 4B:
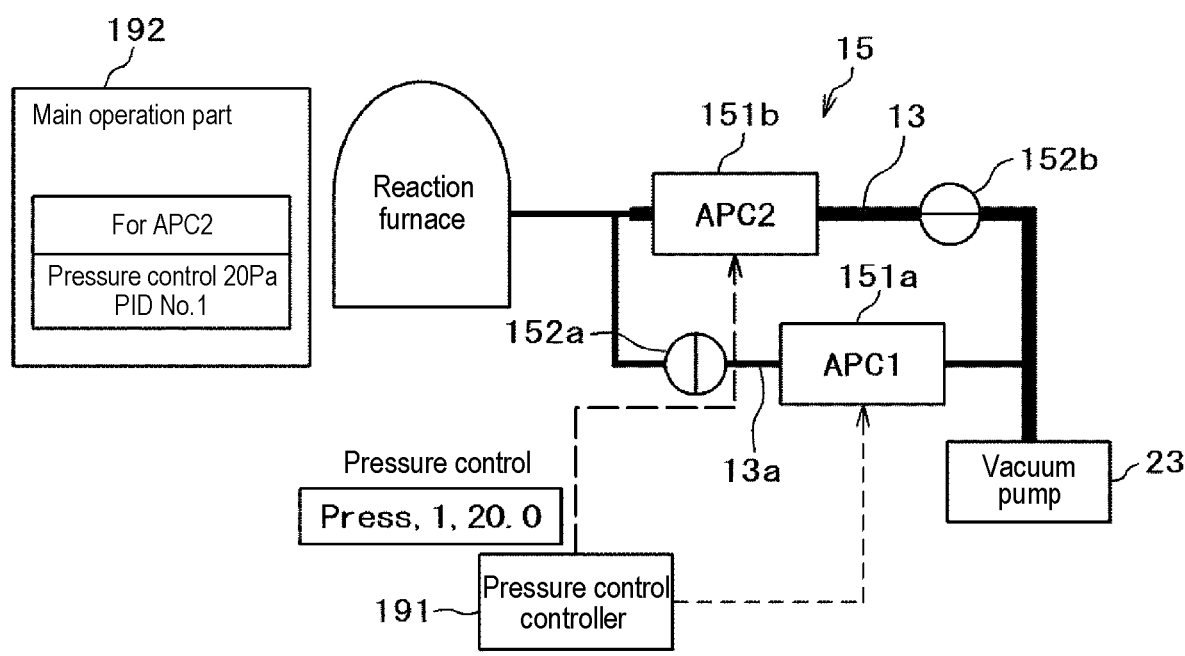
FIG. 4B is a diagram illustrating a case of controlling a high vacuum APC valve.

As shown in FIG. 4B, when it reaches to the pressure 1330 Pa (10 Torr) or lower by the slow exhaust, "for APC2" is set by "APC instruction command" as a pressure control command, the valve 152b of the exhaust line 13 having a large diameter is opened by a valve control command (OPEN), and the high vacuum APC valve 151b is instructed by pressure command (Press, 1, 20.0) as a pressure control command to perform pressure control at 20 Pa. At this time, the valve 152a of the bypass line 13a is closed by a valve control command (CLOSE).

Figure 5A:
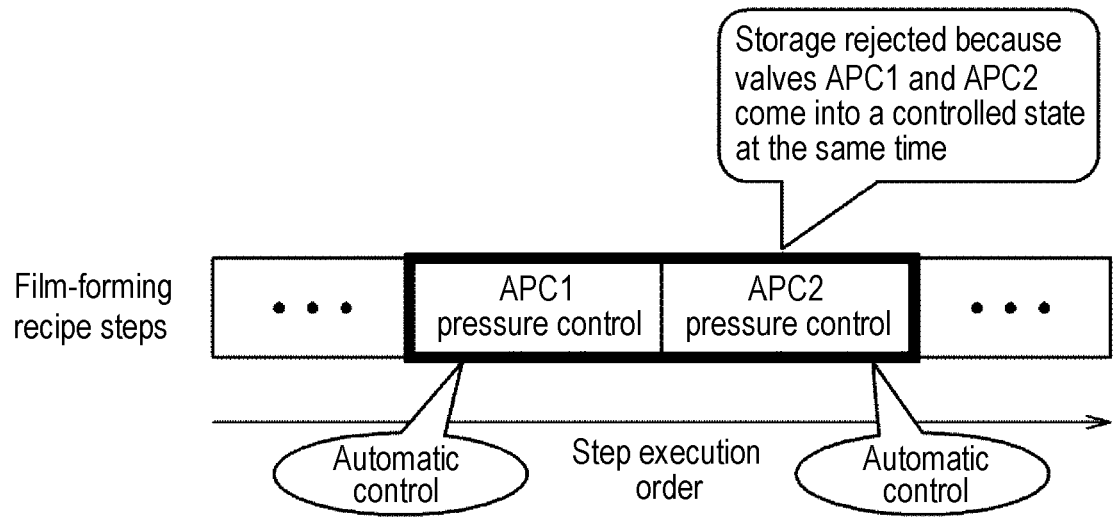
FIG. 5A is a diagram illustrating steps in a film-forming recipe that cannot be set.
Figure 5B:
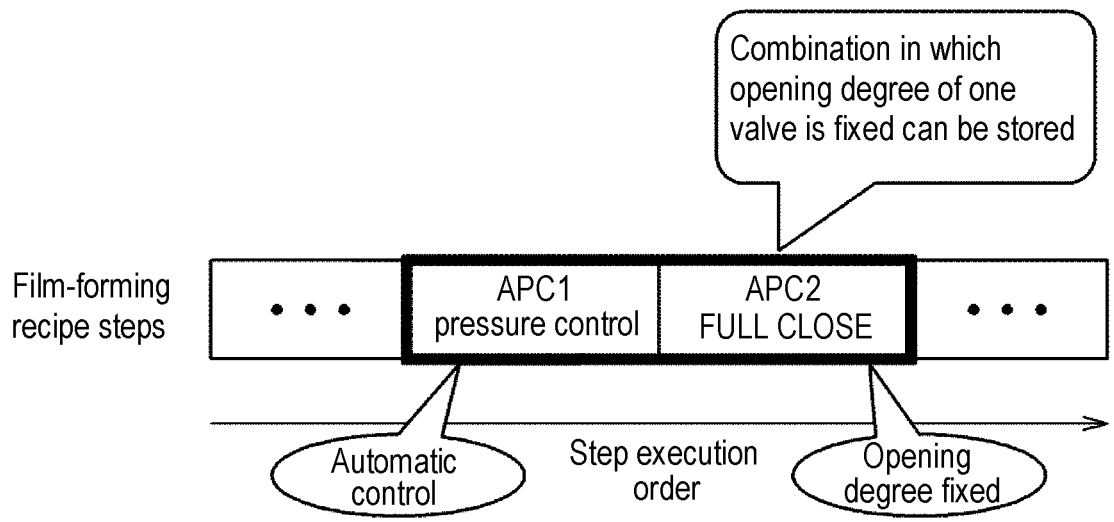
FIG. 5B is a diagram illustrating steps in a film-forming recipe that can be set.

As shown in FIG. 5A, when the pressure control (automatic control) is instructed to the high vacuum APC valve 151b following the pressure control (automatic control) instruction to the wideband APC valve 151a in the film-forming recipe step, the wideband APC valve 151a and the high vacuum APC valve 151b come into a controlled state at the same time. Therefore, each of the pressure controls is adversely affected. When such a combination of commands is present in the film-forming recipe, the film-forming recipe is made non-storable in order to prevent the film formation from being executed. As shown in FIG. 5B, when an instruction to fix the opening degree of one of the valves such as an instruction (FULL CLOSE) to completely close the high vacuum APC valve 151b is issued following the pressure control (automatic control) instruction to the wideband APC valve 151a in the film-forming recipe step, such a combination is made storable.

(Pressure Control)

The details of the pressure control will be described with reference to FIGS. 6 and 7. Since FIGS. 6 and 7 are drawings specialized for pressure control, the boat-loading step represented by the recipe step "B.LOAD" (step S0) and the boat-unloading step represented by the recipe step "B.UN-LOAD" (step S8) may be omitted.

First, the boat 8 is loaded into the process chamber 5 in a state in which a predetermined number of substrates 10 are charged to the boat 8 (step S0). Then, the pressure control controller 191 instructs pressure command "SLOW VAC" to the wideband APC valve 151a based on the recipe step "APC1 slow exhaust" of step No. 1, and instructs an open state (OPEN) to the valve 152a of the bypass line 13a, thereby reducing the pressure in the process chamber 5 from the atmospheric pressure or a higher pressure in an initial state to a second predetermined pressure (P2) (step S1). At this time, the valve 152b of the exhaust line 13 is in a closed state. The diameter of the pipe of the bypass line 13a is adjusted so that the APC valve 151a can be fully opened and the exhaust can be performed at a constant rate of, for example, 1 Pa/sec. By gradually reducing the pressure at a constant rate in this way, it is possible to reduce the swirling-up and backflow of particles without sudden pressure fluctuations in the process chamber 5. In the present embodiments, the pressure is slowly reduced at a constant rate from the pressure (approximately atmospheric pressure) immediately after the boat 8 is loaded into the process chamber 5. However, if the pressure is reduced to a below-described processing pressure (P3) at once, it may take time to execute the recipe. Therefore, the second predetermined pressure (P2) is set to a predetermined pressure higher than the processing pressure (P3). Further, the frictional force between the material (silicon) of the substrates 10 and the material (quartz glass) of the holding grooves (support portions for holding the substrates 10) of the boat 8 is extremely large. This frictional force increases as the pressure in the process chamber 5 decreases. Meanwhile, when the temperature of the substrates 10 rises, thermal expansion is generated so that rubbing occurs between the contact surfaces of the substrates 10 and the holding grooves. Therefore, when the temperature of the process chamber 5 rises in a depressurized state, the substrates 10 and the holding grooves rub against each other with an extremely large frictional force, thereby generating particles. In particular, it is known that when the temperature of the process chamber 5 is raised below 1330 Pa (10 Torr), particles are remarkably generated. Thus, at least the second predetermined pressure (P2) is set to a pressure of 1330 Pa (10 Torr) or more.

Next, the pressure control controller 191 instructs pressure command "PRESS" to the wideband APC valve 151a based on the recipe step "APC1 Press" of step No. 2, adjusts the opening degree of the wideband APC valve 151a, and maintains the second predetermined pressure (P2) for a predetermined time (T3) (step S2). At this time, the valve 152a of the bypass line 13a is in an open state, and the valve 152b of the exhaust line 13 is in a closed state. The temperature control controller 193 included in the controller 19 and configured to control the temperature of the process chamber 5 raises the temperature to a processing temperature, at which the substrates 10 are processed, within the predetermined time (T3) at which the pressure is maintained at the second predetermined pressure (P2).

Figure 7:
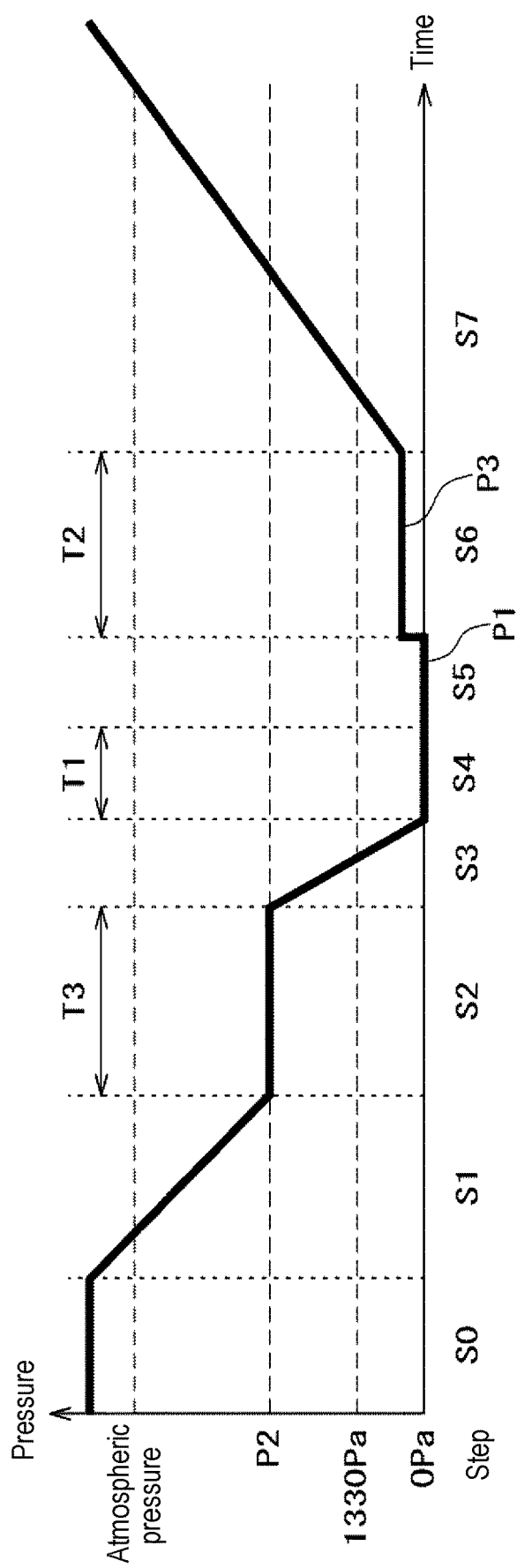
FIG. 7 is a diagram showing the pressures in the process chamber obtained by pressure control based on the steps of the film-forming recipe shown in FIG. 6.

In addition, the pressure control controller 191 instructs pressure command "SLOW VAC" to the wideband APC valve 151a based on the recipe step "APC1 slow exhaust (second stage)" of step No. 3, and instructs an open state (OPEN) to the valve 152a of the bypass line 13a, thereby reducing the pressure in the process chamber 5 to a pressure (e.g., a first predetermined pressure (P1) in FIG. 7) even lower than the second predetermined pressure (P2) (step S3). At this time, the valve 152b of the exhaust line 13 is in a closed state. The APC valve 151a is fully opened and the gas is exhausted at a constant rate of, for example, 1 Pa/sec. The process chamber 5 is maintained at the processing temperature.

Next, the pressure control controller 191 instructs pressure command "FULL CLOSE" to the wideband APC valve 151a based on the recipe step "LEAK CHECK" of step No. 4, and closes at least the wideband APC valve 151a, the valve 152a of the bypass line 13a and the valve 152b of the exhaust line 13 for a first predetermined time (T1) at the time of reaching a limit pressure (a first predetermined pressure (P1) in FIG. 7) at which evacuation can be performed by the vacuum pump 23. In this state, the pressure in the process chamber 5 is detected (step S4). In step S4, the wideband APC valve 151a and the high vacuum APC valve 151b, which are APCs on the side where control is not performed, are closed to perform a leak check in the process chamber 5. During the leak check, the process chamber 5 is maintained at the processing temperature. When it is determined that a leak has occurred in the process chamber 5, the pressure control controller 191 notifies the controller 19 that a leak check error has occurred. The controller 19 causes the leak check to be performed again without proceeding to the next step S5 (performs steps S3 and S4), or forcibly terminates the recipe. When a leak check is performed again, the pressure control controller 191 fully opens the APC valve 151a, evacuates the process chamber 5 at a constant rate of, for example, 1 Pa/sec, and reduces the pressure to the first predetermined pressure (P1) (step S3). Then, the wideband APC valve 151a, the high vacuum APC valve 151b, and the like are closed to perform a leak check in the process chamber 5. Further, when the pressure control controller 191 notifies leak check errors consecutively for a predetermined number of times, the controller 19 determines that a leak check abnormality has occurred, and forcibly terminates the recipe. Specifically, the controller 19 causes the pressure control controller 191 to close the valve 152a of the bypass line 13a, the valve 152b of the exhaust line 13 and the high vacuum APC valve 151b. In this state, an inert gas is supplied to the process chamber 5 from the gas introduction line 11 to increase the pressure in the process chamber 5 to a pressure equal to or higher than the atmospheric pressure (step S7). Then, the recipe is terminated.

If there is no abnormality in the leak check step (step S4), the pressure control controller 191 instructs pressure command "FULL OPEN" to the high vacuum APC valve 151b based the recipe step "APC2 Full Open" of step No. 5, and fully opens the high vacuum APC valve 151b with the valve 152b of the exhaust line 13 kept in an open state, thereby reducing the pressure in the process chamber 5 to a third predetermined pressure (e.g., the first predetermined pressure (P1)) (step S5). At this time, the valve 152a of the bypass line 13a is in a closed state. In this regard, the diameter of the pipe of the exhaust line 13 is set so that exhaust can be performed at a predetermined fixed rate when the high vacuum APC valve 151b is fully opened. The predetermined fixed rate is, for example, from 50 Pa/sec to 100 Pa/sec. As described above, this step S5 is an APC-valve-switching step for switching the control valve from the APC valve 151a to the APC valve 151b. Therefore, it may not set the step time of step S5 until the third predetermined pressure reaches the first predetermined pressure (P1) or the limit pressure. However, since the diameter of the pipe of the exhaust line 13 is larger than the diameter of the pipe of the bypass line 13a, the ultimate pressure when the APC valve 151b is fully opened is lower than the ultimate pressure when the APC valve 151a is fully opened. Therefore, the time until the third predetermined pressure reaches a pressure lower than the first predetermined pressure (P1), for example, an ultimate pressure when the APC valve 151b is fully opened, may be set as the step time of step S5. In the present embodiments, the third predetermined pressure is reduced to the first predetermined pressure (P1), which is lower than the pressure available at the end of the leak check in step S4. However, the reduced pressure is not limited thereto but may be, for example, lower than or higher than the first predetermined pressure P1. The third predetermined pressure is preferably lower than the first predetermined pressure (P1) or the processing pressure. Further, in the same manner as the leak check in step S4, a leak check may be performed in step S5 at the ultimate pressure (third predetermined pressure) available when the APC valve 151b is fully opened. When the leak check is performed in this step (step S5), the leak check in step S4 may be omitted, or the leak check may be executed in both steps. Moreover, in the case of the leak check in step S5, if a leak amount to the extent that the APC valve 151b cannot be opened is given as a leak check error, this recipe is forcibly terminated (step S7). The process chamber 5 is maintained at the processing temperature.

Next, the pressure control controller 191 instructs pressure command "PRESS" to the high vacuum APC valve 151b based on the recipe step "APC2 Press" of step No. 6, and adjusts the opening degree of the high vacuum APC valve 151b, whereby the processing pressure (P3) for processing the substrates 10 is maintained for a second predetermined time (T2) (step S6). At this time, the valve 152a of the bypass line 13a is in a closed state, and the valve 152b of the exhaust line 13 is in an open state. In this regard, the temperature of the process chamber 5 is also maintained at the processing temperature. That is, step S6 is a substrate-processing step in which the substrates 10 are processed while maintaining the processing pressure and the processing temperature. Further, the processing pressure (P3) is set to be higher than the first predetermined pressure (P1) and the third predetermined pressure and lower than the second predetermined pressure (P2). The processing pressure (P3) is maintained in the range of about 10 Pa to about 100 Pa, although it depends on the film type. Since the processing temperature is maintained from step S3 to step S6 after being raised to the processing temperature in step S2, it is preferable that the step time at least from step S3 to step S6 is short.

After the substrate-processing step of step S6 is completed, the pressure control controller 191 instructs pressure command "CLOSE" to the high vacuum APC valve 151b based on the recipe step "APC2 Full Close" of step No. 7, and closes the valve 152a of the bypass line 13a, the valve 152b of the exhaust line 13, and the high vacuum APC valve 151b. In this state, the pressure in the process chamber 5 is increased to the atmospheric pressure or higher (step S7). In step S8 (not shown), a step of unloading the processed substrates 10 from the process chamber 5 (boat unloading) is executed. In the present embodiments, the substrate-processing step refers to step S2 to step S7 as well as step S6. Needless to say, the substrate-processing step may be configured to further include the boat-loading step (step S0) and the boat-unloading step (step S8).

According to the present embodiments, it is possible to perform pressure control for a wide band and for a high vacuum. The pressure control for a wide band makes it possible to gradually reduce the pressure, which makes it possible to suppress the generation of particles. Further, the pressure control for a high vacuum makes it possible to perform stable film formation at a high vacuum. For example, it is possible to perform a low-stress SiN process. As used herein, the term "low-stress SiN" refers to a SiN film having a lower film stress (wafer warp due to film stress) than a normal SiN film. The low-stress SiN is formed at a lower pressure (high vacuum pressure) than a normal SiN film.

(Modification)

In the embodiments, the diameter of the pipe of the bypass line 13a is set so that the exhaust can be performed at a predetermined fixed rate when the wideband APC valve 151a is fully opened, and the wideband APC valve 151a and the high vacuum APC valve 151b are not controlled in parallel. However, the present disclosure is not limited thereto.

For example, the pressure control controller 191 may adjust the opening degrees of the wideband APC valve 151a and the high vacuum APC valve 151b to reduce the pressure in the process chamber 5 from the atmospheric pressure to the second predetermined pressure (P2) and/or from the second predetermined pressure (P2) to the first predetermined pressure (P1) lower than the second predetermined pressure (P2) at a constant rate. This increases the degree of freedom in selecting the diameter of the pipe. Especially, the diameter can be increased. As a result, even one APC valve can be used. Further, the pressure reduction rate from the atmospheric pressure to the second predetermined pressure (P2) and the pressure reduction rate from the second predetermined pressure (P2) to the first predetermined pressure (P1) lower than the second predetermined pressure (P2) can be made different. As a result, it becomes possible to perform fine and precise pressure control.

The present disclosure is applicable to a glass-substrate-processing apparatus such as a LCD apparatus or the like as well as a semiconductor-manufacturing apparatus.

As described above, the present disclosure has been specifically described based on the present embodiments and the modification. However, the present disclosure is not limited to the present embodiments and the modification, but can be variously modified.

According to the present disclosure in some embodiments, it is possible to perform pressure control in a wide band and in a high vacuum range.

What is claimed is:

1. A substrate processing apparatus, comprising:
   a process chamber configured to process a substrate;
   an exhaust line including a second pressure regulation valve;
   a bypass line including a first pressure regulation valve;
   a pressure detector installed in the exhaust line and configured to detect a pressure in the process chamber; and
   a controller configured to receive pressure information of the process chamber from the pressure detector and control the first pressure regulation valve and the second pressure regulation valve based on the pressure information received from the pressure detector,
   wherein the controller is configured to perform following (a) through (f) sequentially in this order:
   (a) adjusting an opening degree of the first pressure regulation valve, based on the pressure information received from the pressure detector, to reduce a pressure in the process chamber from an atmospheric pressure to a second predetermined pressure;
   (b) adjusting the opening degree of the first pressure regulation valve, based on the pressure information received from the pressure detector, to maintain the second predetermined pressure;
   (c) adjusting the opening degree of the first pressure regulation valve, based on the pressure information received from the pressure detector, to reduce the pressure in the process chamber to a first predetermined pressure that is lower than the second predetermined pressure;
   (d) detecting, by receiving the pressure information from the pressure detector, the pressure in the process chamber in a state in which at least the first pressure regulation valve and the second pressure regulation valve are closed for a first predetermined time when the first predetermined pressure is reached;
   (e) adjusting an opening degree of the second pressure regulation valve, based on the pressure information received from the pressure detector, to reduce the pressure in the process chamber to a third predetermined pressure that is lower than the second predetermined pressure; and
   (f) adjusting the opening degree of the second pressure regulation valve, based on the pressure information received from the pressure detector, to maintain a processing pressure at which the substrate is processed.

2. The substrate processing apparatus of claim 1, wherein the controller is configured to make the processing pressure to be higher than the first predetermined pressure and the third predetermined pressure and to be lower than the second predetermined pressure.

3. The substrate processing apparatus of claim 1, wherein the controller is configured to, after the processing pressure is maintained for a second predetermined time, increase the pressure in the process chamber to the atmospheric pressure or higher in a state in which the first pressure regulation valve and the second pressure regulation valve are closed.

4. The substrate processing apparatus of claim 1, wherein if it is determined that a leak has occurred as a result of detecting the pressure in the process chamber in the state in which at least the first pressure regulation valve and the second pressure regulation valve are closed for the first predetermined time when the first predetermined pressure is reached, the controller is configured to bring the pressure in the process chamber to the first predetermined pressure again and to check the leak in the process chamber in the state in which the first pressure regulation valve and the second pressure regulation valve are closed.

5. The substrate processing apparatus of claim 1, wherein the controller is configured to increase the temperature in the process chamber to a processing temperature at which the substrate is processed for a predetermined time during which the second predetermined pressure is maintained.

6. The substrate processing apparatus of claim 1, wherein a diameter of a pipe of the exhaust line where the second pressure regulation valve is installed is set to be larger than a diameter of a pipe of the bypass line where the first pressure regulation valve is installed.

7. The substrate processing apparatus of claim 1, wherein the controller is further configured to:
   in (a), reduce the pressure in the process chamber at a first constant rate from the atmospheric pressure to the second predetermined pressure; and/or
   in (c), reduce the pressure in the process chamber at a second constant rate from the second predetermined pressure to the first predetermined pressure that is lower than the second predetermined pressure.

8. The substrate processing apparatus of claim 1, wherein a diameter of a pipe of the bypass line is set to allow the process chamber to be exhausted at a predetermined fixed rate according to the opening degree of the first pressure regulation valve.

* * * * *